(12) United States Patent
Mardi et al.

(10) Patent No.: US 8,493,071 B1
(45) Date of Patent: Jul. 23, 2013

(54) SHORTED TEST STRUCTURE

(75) Inventors: Mohsen H. Mardi, Saratoga, CA (US);
Joseph M. Juane, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 661 days.

(21) Appl. No.: 12/577,036

(22) Filed: Oct. 9, 2009

(51) Int. Cl.
*G01R 31/02* (2006.01)
*G01R 31/28* (2006.01)

(52) U.S. Cl.
CPC ................................. *G01R 31/2805* (2013.01)
USPC ......................................................... 324/537

(58) Field of Classification Search
None
See application file for complete search history.

(56) References Cited

U.S. PATENT DOCUMENTS

| | | | | |
|---|---|---|---|---|
| 3,783,353 A | * | 1/1974 | Pankove | 257/76 |
| 4,056,773 A | * | 11/1977 | Sullivan | 324/500 |
| 4,326,931 A | * | 4/1982 | Kamijo et al. | 205/138 |
| 5,686,843 A | * | 11/1997 | Beilstein et al. | 324/750.05 |
| 5,925,203 A | * | 7/1999 | Riddle et al. | 156/89.16 |
| 6,034,851 A | * | 3/2000 | Zarouri et al. | 360/137 |
| 6,256,207 B1 | * | 7/2001 | Horiuchi et al. | 361/760 |
| 7,157,927 B2 | * | 1/2007 | Okajima | 324/750.3 |
| 7,196,294 B2 | * | 3/2007 | Hofmeister et al. | 219/499 |
| 7,218,820 B2 | * | 5/2007 | Maida, Jr. | 385/100 |
| 7,541,203 B1 | | 6/2009 | Knickerbocker | |
| 7,714,235 B1 | * | 5/2010 | Pedersen et al. | 174/267 |
| 8,193,643 B2 | * | 6/2012 | Tojo et al. | 257/774 |

FOREIGN PATENT DOCUMENTS

JP 10221372 A * 8/1998

OTHER PUBLICATIONS

U.S. Appl. No. 13/331,702, filed Dec. 20, 2011, Rahman et al.
3M, *3M Anisotropic Conductive Film (ACF) Adhesive 5363 Rework Process*, Mar. 2008, pp. 1-11, 3M Electronics Markets Materials Division, St. Paul, Minnesota, USA.

* cited by examiner

*Primary Examiner* — Paresh Patel
(74) *Attorney, Agent, or Firm* — LeRoy D. Maunu; Thomas George

(57) ABSTRACT

A shorted test structure and methods for making it are disclosed. A conductive layer is applied over a first surface of a blank substrate. The blank substrate has a plurality of conductive vias that electrically connect solder lands on the first surface of the blank substrate to corresponding solder contacts on a second surface of the substrate. The conductive layer electrically couples the solder lands.

20 Claims, 4 Drawing Sheets

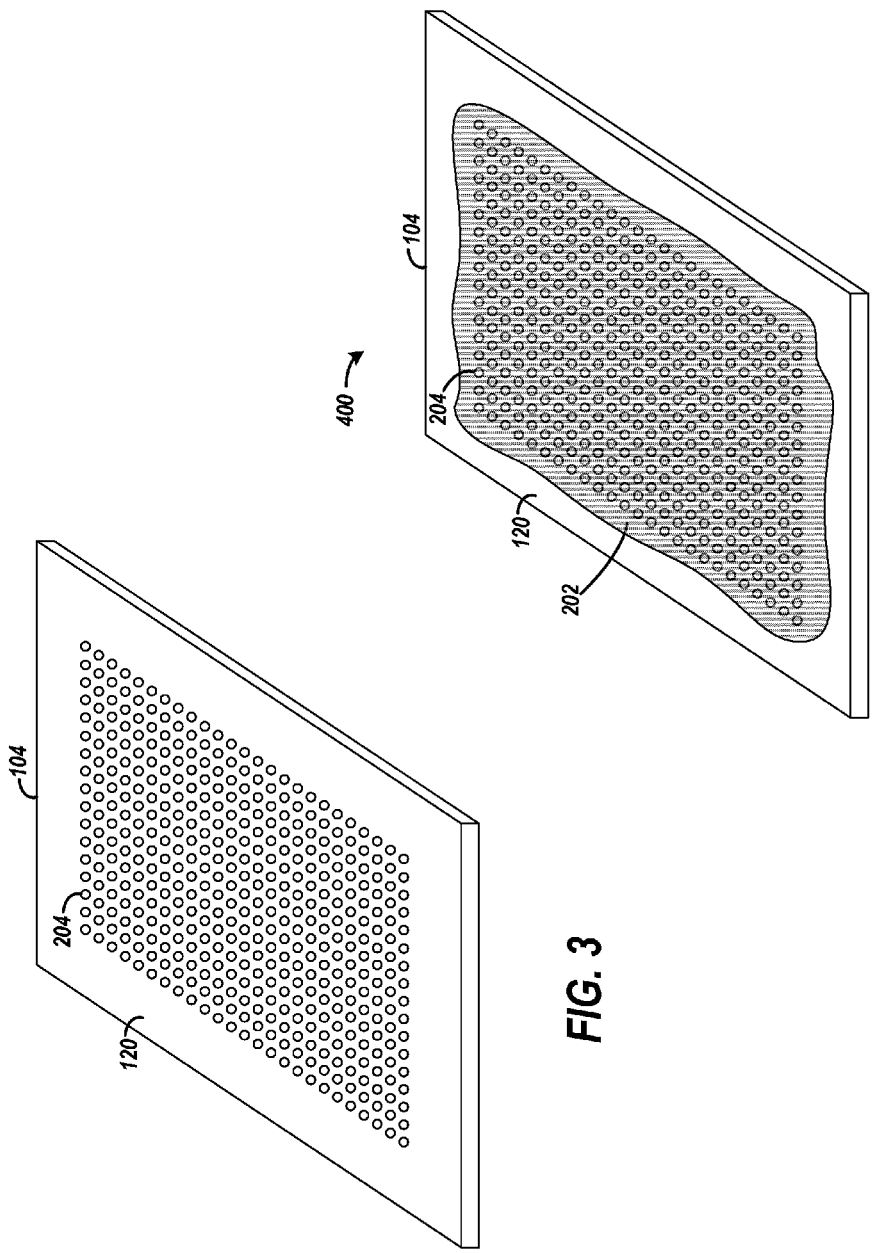

SHORTED TEST STRUCTURE

FIELD OF THE INVENTION

The present invention generally relates to a short-circuited test structure.

BACKGROUND

One test performed on integrated circuits and their packages involves checking for short circuits. Examples of test machines used for such testing include the CheckSum Model TR-8, Teradyne J750 family and FLEX™ test systems, and the Agilent/Verigy 93K test system.

Before testing a device for short circuits, however, it is prudent to verify that the testing apparatus is able to detect a short circuit on the target device. One approach for verifying this capability on the testing apparatus is to design and build a custom substrate having short circuits between solder lands to which an integrated circuit die would normally be attached for ready-for-use product. The process of designing and building a customized substrate with solder lands short circuited may be slow and expensive.

The process for creating the short circuited substrate may entail creating a design of the desired substrate with the desired short circuits. Once complete, the design is translated into a format that specifies the process steps for building a physical substrate. Then the substrate is manufactured according to the design. Thus, a special manufacturing run may be required to create the short circuited substrate.

The present invention may address one or more of the above issues.

SUMMARY

The various embodiments of the invention provide approaches for making and using a shorted test structure. A conductive layer is applied over a first surface of a blank substrate. The blank substrate has a plurality of conductive vias that electrically connect solder lands on the first surface of the blank substrate to corresponding solder contacts on a second surface of the substrate. The conductive layer electrically couples the solder lands.

A method for verifying short-circuit test functions of a test apparatus includes applying a conductive layer over a first surface of a blank substrate. The blank substrate has a plurality of conductive vias that connect solder lands on the first surface of the blank substrate to corresponding solder contacts on a second surface of the substrate. The conductive layer electrically couples the solder lands. The substrate having the conductive layer is coupled to a test apparatus via the solder balls. The substrate is tested for short circuits on the test apparatus.

In another embodiment, a test structure comprises a blank substrate having a plurality of conductive vias that connect solder lands on a first surface of the blank substrate to corresponding solder contacts on a second surface of the substrate. A conductive layer on the first surface of the blank substrate electrically couples the solder lands.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which:

FIG. 3 is a perspective view of a blank substrate;

FIG. 4 is a perspective view of a test structure in which a conductive layer has been applied to the blank substrate for electrically coupling all the solder lands on the substrate in accordance with an embodiment of the invention.

DETAILED DESCRIPTION

One or more embodiments of the invention generally provide methods and structures for verifying functions of a testing apparatus that test for short circuits. One or more embodiments of the invention begin with a blank substrate that, assuming it has no defects, is suitable for use for mounting an IC die and packaging a ready-for-use product. Instead of mounting the IC die, a conductive layer is applied over a first surface of the blank substrate on which the die would ordinarily be mounted. The blank substrate has a plurality of conductive vias that electrically connect solder lands on the first surface of the blank substrate to corresponding solder balls on a second surface of the substrate. The conductive layer electrically couples the solder lands on the first surface. Once the conductive layer is applied, the substrate is coupled to a test apparatus via the solder balls. In testing the substrate, the test apparatus will report short circuits if operating correctly. By using readily available materials such as conductive paint, solder, or metal tape, a blank substrate, which in normal use is production-ready, may be transformed into a structure for testing the test apparatus. This alleviates the problems associated with creating a customized blank substrate for testing the test apparatus. Those skilled in the art will recognize that suitable combinations of different materials may be used for the conductive layer in alternative embodiments.

Figure 1:
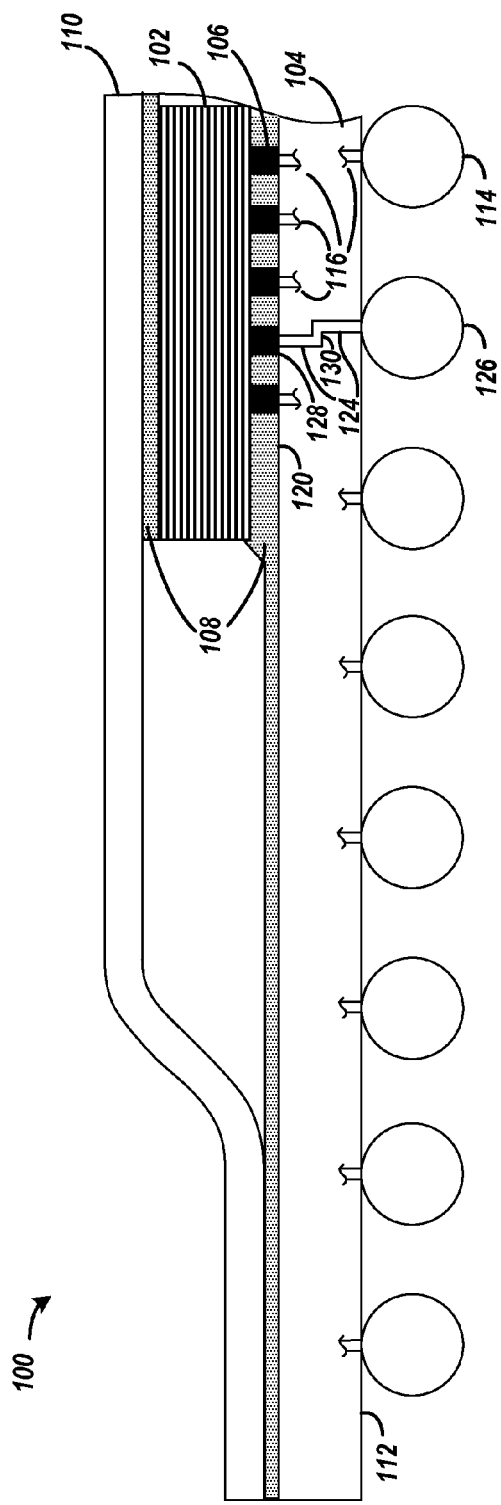
FIG. 1 is a cross-sectional view of an example integrated circuit package.

FIG. 1 is a cross-sectional view of an example integrated circuit package 100. An IC die 102 is electrically coupled to a package substrate 104 with a ball grid array and corresponding solder land array. Element 106 shows a combination of one of the balls of the die 102 connected to one of the solder lands of the substrate 104. Molding compound 108 encapsulates the IC die 102 and typically flows into the gaps between the solder lands and solder balls. The molding compound is a silica- or glass-loaded epoxy molding compound. Other types of filler, molding or encapsulant compounds suitable for molded under-fill applications may be used alternatively. In one embodiment, the package 100 includes an optional metallic lid 110, which may be attached to the substrate 104 with the epoxy.

The substrate 104 includes an array of contacts disposed on surface 112 to provide an interface to the die 102 for other devices and packages mounted on a printed circuit board (PCB). For example, the contacts may comprise solder balls 114 forming a ball grid array (BGA) interface to a PCB. Alternatively, the contacts may comprise pads (not shown) forming a land grid array (LGA) interface to the PCB.

The substrate 104 includes conductive interconnect comprising a plurality of conductive layers (not shown) and a plurality of vias 116 connecting the conductive layers. The substrate further includes surface 120 having lands for connecting with solder balls of the IC die 102, where the solder land and solder ball are shown together as element 106. The combination of the conductive vias and conductive layers (not shown) provide signal routing between the solder balls on surface 112 to the lands on surface 120. Each of the elements 106 is electrically coupled to one of the solder balls 114 via a combination of conductive vias and conductive layers formed in the substrate. For example vias 124 electrically couple solder ball 126 to element 128. It will be appreciated that horizontal segment 130 is a portion of a metal layer that connects vias 124. The other conductive vias 116 are shown as partial vias for ease of illustration. The substrate 104 may be supported by plated through-hole (PTH) technology or build-up technology depending on application requirements.

Figure 2:
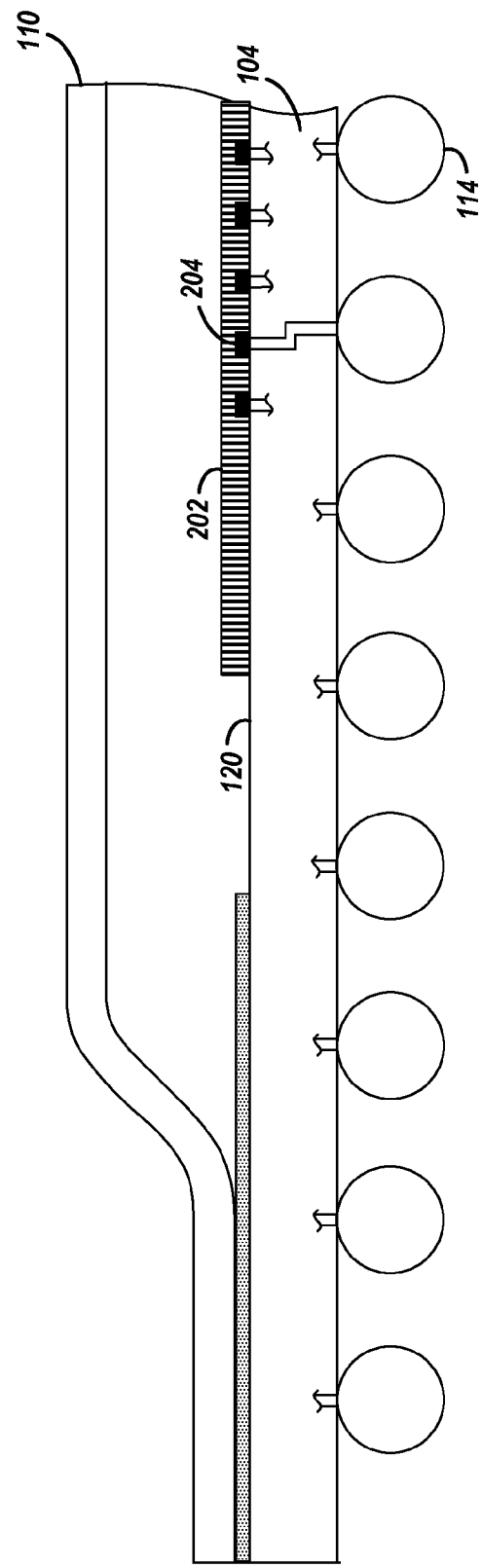
FIG. 2 is a cross-sectional view of a test structure in accordance with an embodiment of the invention.

FIG. 2 is a cross-sectional view of a test structure in accordance with an embodiment of the invention. The basic test structure includes blank substrate 104 to which a conductive layer 202 has been applied to surface 120 for electrically coupling the solder lands 204. Notably absent is the IC die 102 from the package 100 of FIG. 1. Since the purpose of the test structure is to test the short circuit testing capabilities of a test apparatus, the IC die is not needed. In one embodiment, the lid 110 is attached to the substrate 104 with epoxy as described above.

The conductive layer 202 electrically inter-couples all of the solder lands of the substrate. By doing so, a properly operating test system will detect and show short circuits between every pair of solder balls 114 of the substrate. This mimics the test system detecting short circuits in an actual package 100 having an IC die 102.

Various alternatives are available for creating the conductive layer on the substrate. In order to save time and money, the alternative materials are readily available and easy to apply. For example, the conductive layer may be formed from paint that is conductive, e.g., metal-based paint, solder, or metal tape, for example. An example, metal paint is PELCO® Conductive Liquid Silver Paint available from Ted Pella, Inc. of Redding, Calif., which contains 60% Ag. Those skilled in the art will recognize other suitable conductive coatings that are easy to apply, such as conductive resins, cements, pastes, epoxies etc., may also be used.

FIG. 3 is a perspective view of a blank substrate 104. The view of the substrate shows surface 120 with a plurality of solder lands 204 exposed. The solder lands are connected to the conductive vias as shown in FIGS. 1 and 2. In one embodiment, the blank substrate is the same as a substrate which would be used to mount an IC die. In another embodiment, the blank substrate may be that used to mount another substrate. Thus, the blank substrate may be a carrier substrate of an interposing substrate depending on test objectives.

FIG. 4 is a perspective view of a test structure 400 in which a conductive layer 202 has been applied to the blank substrate 104 for electrically coupling all the solder lands on the substrate in accordance with an embodiment of the invention. In one embodiment, all the solder lands are covered with the conductive layer. Depending on test objectives, it may be acceptable in other embodiments to cover only selected ones of the solder lands 204 and not cover others of the solder lands with the conductive layer.

The method by which the conductive layer is applied to the substrate depends on the material chosen to be applied. For example, the material may be brushed, sprayed, or taped to the surface 120 of the substrate. For some materials, such as conductive paint, two or more coats may be desirable. When using the PELCO® Conductive Liquid Silver Paint it has been found that curing the painted substrate for approximately 10 minutes at 125° C. provides adequate curing.

Figure 5:
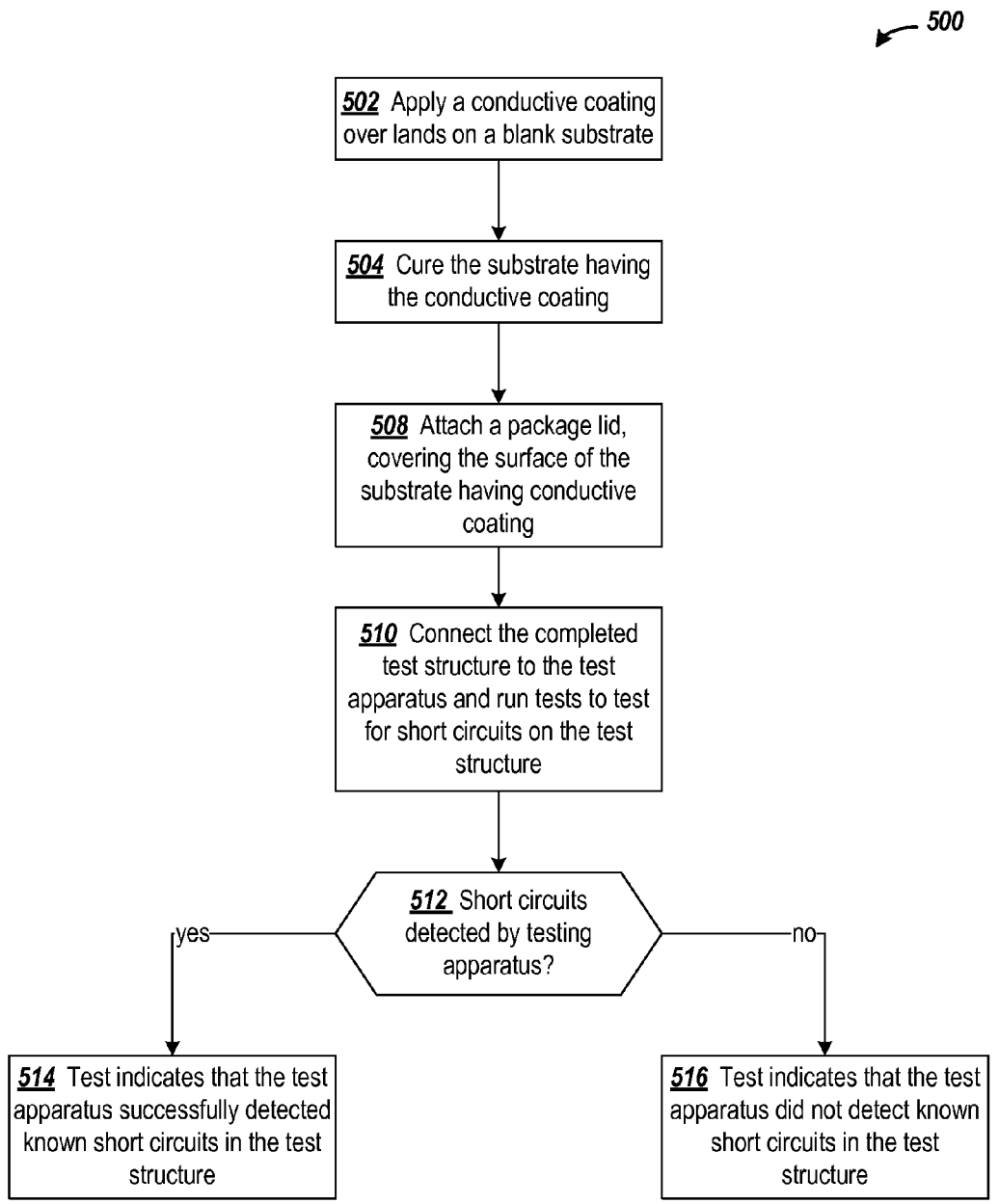
FIG. 5 is a flowchart of an example process for testing the short circuit test capabilities of a test system using a test structure in accordance with one or more embodiments of the invention.

FIG. 5 is a flowchart of an example process 500 for testing the short circuit test capabilities of a test system using a test structure in accordance with one or more embodiments of the invention. At step 502, a conductive coating is applied to a blank substrate on the surface having solder lands for attaching an IC die, for example. Depending on the type of conductive coating applied, the material may have to be cured before proceeding with the test, as indicated by step 504.

Optionally, a package lid may be attached to the substrate at step 508 after application of the conductive coating. The lid may be beneficial for handling the package for mounting on the test apparatus. It will be recognized that some test apparatus and substrates may not benefit from having a lid, and in those instances attaching the lid may be omitted.

At step 510, the completed test structure is connected to the test apparatus, and the test apparatus is operated to test for short circuits on the test structure. The manner in which the test structure is mounted on the test apparatus and the test are performed will vary from apparatus to apparatus.

If the test apparatus detected short circuits on the test structure (decision step 512), the test indicates that the testing apparatus is operating as expected (step 514). On the other hand, if the test apparatus failed to detect short circuits on the test structure, the test indicates that the test apparatus is not operating as expected (step 516).

The present invention is thought to be applicable to a variety of systems for testing IC electronic circuit packages. Other aspects and embodiments of the present invention will be apparent to those skilled in the art from consideration of the specification and practice of the invention disclosed herein. It is intended that the specification and illustrated embodiments be considered as examples only, with a true scope and spirit of the invention being indicated by the following claims.

What is claimed is:

1. A method for making a shorted test structure, comprising:

applying a conductive layer over a first surface of a blank substrate, wherein the blank substrate has a plurality of conductive vias that electrically connect solder lands on the first surface of the blank substrate to corresponding solder contacts on a second surface of the substrate, and the conductive layer electrically couples the solder lands;

wherein the solder lands are arranged in an array and the conductive layer electrically connects each solder land in the array to all other solder lands in the array, and areas of the first surface between adjacent ones of the solder lands are completely covered with the conductive layer; and attaching a lid to the first surface of the blank substrate, wherein a void is created between the conductive layer and a surface of the lid that faces the conductive layer.

2. The method of claim 1, wherein the applying includes applying conductive paint with a brush.

3. The method of claim 1, wherein the applying includes spraying conductive paint.

4. The method of claim 1, wherein the applying includes spreading two or more coats of conductive paint.

5. The method of claim 1, wherein the conductive layer includes solder.

6. The method of claim 1, wherein the conductive layer includes metal tape.

7. The method of claim 1, wherein the substrate is an interposing substrate.

8. The method of claim 1, wherein the substrate is a carrier substrate.

9. The method of claim 1, further comprising attaching a package lid to the substrate, the package lid covering the conductive layer.

10. The method of claim 1, wherein the conductive layer is a metal paint and further comprising curing the painted substrate for approximately 10 minutes at 125° C.

11. A method for verifying short-circuit test functions of a test apparatus, comprising:

applying a conductive layer over a first surface of a blank substrate, wherein the blank substrate has a plurality of conductive vias that connect solder lands on the first surface of the blank substrate to corresponding solder contacts on a second surface of the substrate, and the conductive layer electrically couples the solder lands;

wherein the solder lands are arranged in an array and the conductive layer electrically connects each solder land in the array to all other solder lands in the array, and areas of the first surface between adjacent ones of the solder lands are completely covered with the conductive layer;

attaching a lid to the first surface of the blank substrate, wherein a void is created between the conductive layer and a surface of the lid that faces the conductive layer;

coupling the substrate having the conductive layer to a test apparatus via the solder balls; and testing for short circuits on the substrate on the test apparatus.

12. The method of claim 11, wherein the applying includes applying conductive paint with a brush.

13. The method of claim 11, wherein the applying includes spraying conductive paint.

14. The method of claim 11, wherein the applying includes spreading two or more coats of conductive paint.

15. The method of claim 11, wherein the conductive layer includes solder.

16. The method of claim 11, wherein the conductive layer includes metal tape.

17. A test structure, comprising:

a blank substrate having a plurality of conductive vias that connect solder lands on a first surface of the blank substrate to corresponding solder contacts on a second surface of the substrate;

wherein the solder lands are arranged in an array;

a conductive layer on the first surface of the blank substrate, wherein the conductive layer electrically connects each solder land in the array to all other solder lands in the array, and areas of the first surface between adjacent ones of the solder lands are completely covered with the conductive layer; and a lid attached to the first surface of the blank substrate, wherein a void is present between the conductive layer and a surface of the lid that faces the conductive layer.

18. The test structure of claim 17, wherein the conductive layer includes conductive paint.

19. The test structure of claim 17, wherein the conductive layer includes solder.

20. The test structure of claim 17, wherein the conductive layer includes metal tape.

* * * * *